United States Patent
Suzuki et al.

(10) Patent No.: US 6,379,781 B1
(45) Date of Patent: Apr. 30, 2002

(54) PRINTED CIRCUIT BOARD MATERIAL AND METHOD OF MANUFACTURING BOARD MATERIAL AND INTERMEDIATE BLOCK BODY FOR BOARD MATERIAL

(75) Inventors: Tomio Suzuki, Yokkaichi; Tadashi Otagiri; Satoru Kawai, both of Nagoya; Shuhei Ishikawa, Handa, all of (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/446,768

(22) PCT Filed: Apr. 27, 1999

(86) PCT No.: PCT/JP99/02257

§ 371 Date: Dec. 23, 1999

§ 102(e) Date: Dec. 23, 1999

(87) PCT Pub. No.: WO99/57948

PCT Pub. Date: Nov. 11, 1999

(30) Foreign Application Priority Data

| May 6, 1998 | (JP) | 10-123289 |
| Jul. 22, 1998 | (JP) | 10-206110 |
| Jul. 22, 1998 | (JP) | 10-206111 |

(51) Int. Cl.$^7$ ................................................ B32B 3/00
(52) U.S. Cl. .................. 428/209; 174/250; 174/258; 174/262; 439/63; 428/901
(58) Field of Search ................ 428/209, 901; 174/250, 251, 258, 262; 439/63, 65

(56) References Cited

U.S. PATENT DOCUMENTS

| 3,697,668 A | * | 10/1972 | Campbell | 174/68.5 |
| 3,739,467 A | * | 6/1973 | Antier et al. | 29/604 |
| 4,833,402 A | * | 5/1989 | Boegh-Petersen | 324/754 |
| 5,144,536 A | * | 9/1992 | Tsukada et al. | 361/402 |
| 5,571,609 A | * | 11/1996 | St. Lawrence et al. | 442/234 |
| 5,919,546 A | * | 7/1999 | Horiuchi et al. | 428/131 |
| 6,017,225 A | * | 1/2000 | Michiya et al. | 439/86 |
| 6,038,133 A | * | 3/2000 | Nakatani et al. | 428/206 |
| 6,207,259 B1 | * | 3/2001 | Iino et al. | 428/209 |

FOREIGN PATENT DOCUMENTS

| JP | 49-8759 | 1/1974 |
| JP | 54-54274 | 4/1979 |
| JP | 55-7033 | 2/1980 |
| JP | 62-230093 | 10/1987 |
| JP | 3-112187 | 5/1991 |
| JP | 6-21593 | 1/1994 |
| JP | 6-120626 | 4/1994 |
| JP | 8-78580 | 3/1996 |

* cited by examiner

*Primary Examiner*—Cathy Lam
(74) *Attorney, Agent, or Firm*—Burr & Brown

(57) ABSTRACT

A substrate material (10) for printed circuit, comprising a sheet-shaped composite material (11) composed of a plastic and a ceramic and conductive metal wires (12) fixed in the composite material (11) at given pitches, wherein the two surfaces of the substrate material (10) have electrical connection to each other via the metal wires (12). A process for producing a substrate material for printed circuit, which comprises stretching, in a mold, conductive metal wires at given pitches, then pouring, into the mold, a composite material composed of a plastic and a ceramic, curing the composite material, thereafter slicing the resulting material in a direction approximately perpendicular to the direction of the metal wires. Good electrical connection can be secured, and it is possible to prevent, during use, peeling between substrate material and conductive layers and between insulating material and metal wires. A printed circuit board of high density and excellent dimensional accuracy can be obtained.

23 Claims, 6 Drawing Sheets

AFTER ETCHING OF COPPER FOIL

AFTER ETCHINGS OF EPOXY RESIN

PRINTED CIRCUIT BOARD MATERIAL AND METHOD OF MANUFACTURING BOARD MATERIAL AND INTERMEDIATE BLOCK BODY FOR BOARD MATERIAL

TECHNICAL FIELD

The present invention relates to a substrate material which is an intermediate for a printed circuit board, a process for production of the substrate material, and an intermediate block used in production of the substrate material.

BACKGROUND ART

Printed circuit boards have, at one side, slots for integrated circuit and terminals for connecting various electronic parts and, at another side, printed conductive paths for connecting the parts, and have been used in a large amount as a key member of electronic appliances.

FIG. 6 is a perspective view showing a printed circuit board. In FIG. 6, a substrate material 1 comprises a sheet-shaped material composed of an insulating material (e.g. epoxy resin or glass) and a conductive metal 2 formed in the sheet-shaped material by plating or the like so as to electrically connect the two surfaces of the sheet-shaped material; on the two surfaces of the substrate material 1 is laminated a photoprocess layer 3 (a conductive layer) in which a predetermined conductive pattern (circuit) is formed; above and below the photoprocess layer 3 are formed terminals and conductive paths 4 by printing or the like; thereby, a printed circuit board is constituted.

The substrate material 1 used in printed circuit boards has heretofore been produced, for example, by producing a sheet-shaped material composed of an insulating material (e.g. epoxy resin or glass), making through holes (for electrical connection) at the predetermined positions of the sheet-shaped material by drilling, filling the through holes with a conductive metal (e.g. copper) by means of plating or the like, and sealing the through holes with a sealant.

In the above production, however, drilling in the shaped material generates chips and has had a fear of producing defective products, and plating has had a high possibility of generating cracks at the periphery of the substrate material, inviting poor electrical connection. Further, in the drilling, the achievable ratio of through hole length (substrate thickness)/hole diameter is at best about 5 and, in, for example, a substrate material having a thickness of 1 mm, the lower limit of hole diameter is about 0.2 mm. In order to obtain a printed circuit board of high density, a smaller hole diameter is preferred; however, such a hole diameter has been difficult to achieve by drilling.

There was proposed a circuit board obtained by inserting, into a frame, electric wires composed of Ni, Co or the like, pouring thereinto a molten insulating material composed of an epoxy resin or the like, curing the insulating material, and cutting the resulting material at a plane perpendicular to the metal wires to allow the two surfaces of the cut material to have electrical connection to each other (see JP-A-49-8759).

In this circuit board, however, the epoxy resin or the like used causes, in curing, a volume shrinkage of about 2 to 3%, which has impaired the dimensional accuracy of through hole pitches, etc. This has been a big drawback because dimensional accuracy is very important in high-density printed circuit boards.

Further in this circuit board, since no attention is paid to the difference in thermal expansion between the substrate material and the conductive layer [photoprocess layer] laminated on one or both surfaces of the substrate material, peeling may occur between the substrate material and the conductive layer owing to the impact and/or temperature difference during use. There has also been a fear of peeling between the insulating material and the metal wires.

Hence, in view of the above-mentioned conventional problems, the present invention has an object of providing a substrate material for printed circuit, which ensures good electrical connection and possesses controlled thermal expansion so as to eliminate the peeling during use between the substrate material and the conductive layer and between the insulating material and the metal wires; and a process for production of such a substrate material for printed circuit.

Another object of the present invention is to provide a substrate material for a printed circuit, which can give a printed circuit board of high density and has excellent dimensional accuracy; and a process for production of such a substrate material for printed circuit.

Still another object of the present invention is to provide an intermediate block from which the above substrate material for a printed circuit can be produced easily and efficiently.

DISCLOSURE OF THE INVENTION

According to the present invention, there is provided a substrate material for a printed circuit, comprising a sheet-shaped composite material composed of a plastic and a ceramic and conductive metal wires fixed in the composite material at given pitches, wherein the two surfaces of the substrate material have electrical connection to each other via the metal wires.

The substrate material of the present invention preferably has a copper layer on one or both sides because it enables easier pattern formation. The content of the ceramic in the composite material is preferably 40 to 90% by volume because it can make smaller the volume contraction during curing. It is preferred from the standpoint of prevention of peeling of the metal wires from the composite material that in the composite material, the plastic and the ceramic have each been subjected to a coupling treatment and further that the metal wires and the composite material are bonded to each other by a coupling agent.

It is desirable that the composite material is composed of an epoxy resin and a glass fiber cut into a predetermined length or glass beads, because the resulting substrate material has no anisotropy in thermal expansion and can have an intended strength.

Also in the substrate material of the present invention, it is preferred that the metal wires used have an aspect ratio (length/diameter) of 8 or larger, that the metal wires are fixed in the sheet-shaped composite material at pitches of 1.1 mm or smaller, and that the metal wires have a diameter (corresponding to the diameter of through holes or via holes) of 0.2 mm or smaller, because a high-density printed circuit board is obtainable.

The substrate material of the present invention can be allowed to show isotropic thermal expansion and have a thermal expansion coefficient of 5 to 30 ppm/° C.; the composite material can be allowed to have a thermal expansion coefficient at least equal to that of the metal wires; and the difference between the two thermal expansion coefficients can be made as small as 1 to 10. Thereby, the reliability in the temperature history of steps can be made very high.

According to the present invention, there is also provided an intermediate block used in production of a substrate material for a printed circuit, comprising a composite material composed of a plastic and a ceramic and conductive wires fixed in the composite material at given pitches, wherein the content of the ceramic in the composite material is 40 to 90% by volume and wherein the metal wires extend lineally from one surface of the intermediate block to other surface of the intermediate block facing the one surface and project from the two surfaces.

In the substrate material for printed circuit and the intermediate block therefor, both of the present invention, the metal wires are composed preferably of any one metal selected from copper, copper alloys, aluminum and aluminum alloys and, in view of the standpoints of conductivity, abrasion resistance, flexibility, oxidation resistance, strength, etc., more preferably of beryllium copper.

According to the present invention, there is also provided a process for producing a substrate material for a printed circuit, which comprises stretching, in a mold, conductive metal wires at given pitches, then pouring, into the mold, a composite material composed of a plastic and a ceramic, curing the composite material, thereafter slicing the resulting material in a direction approximately perpendicular to the direction of the metal wires.

In the above production process, the thermal expansion coefficient of the material constituting the mold is preferably larger than that of the metal wires, and the metal wires have a diameter of preferably 0.2 mm or smaller and are fixed in the mold at pitches of preferably 1.1 mm or smaller.

BRIEF DESCRIPTION OF THE DRAWINGS

FIG. 2(a) shows a substrate material; FIG. 2(b) shows an example in which an epoxy resin has been coated on a substrate material.

FIG. 3(a) is an example in which a resist pattern has been formed on a copper foil; FIG. 3(b) shows a state after etching of copper foil; and FIG. 3(c) shows a state after etching of epoxy resin.

FIG. 4(a) shows a state after electroless copper plating; and FIG. 4(b) shows a state after electrolytic copper plating.

FIG. 5(a) shows a state after lamination of a film-shaped resist and subsequent development; and FIG. 5(b) shows a state after peeling of a resist and subsequent etching.

BEST MODE FOR CARRYING OUT THE INVENTION

The present invention is described in more detail below based on the embodiments.

The substrate material for a printed circuit according to the present invention comprises a composite material composed of a plastic and a ceramic and metal wires fixed in the composite material at given pitches, wherein the metal wires ensure electrical connection between the two surfaces of the substrate material.

The substrate material comprising a composite material and metal wires fixed therein at given pitches can be used as a standard substrate for a printed circuit, can therefore be used in various circuits and applications, and are very desirable. Further, comprising a composite material composed of a plastic and a ceramic, the substrate material is good in moldability and excellent in insulation, thermal expansion (i.e. low thermal expansion) and abrasion resistance; furthermore, by varying the kinds and compounding ratio of the plastic and the ceramic, the substrate material can possess controlled thermal expansion matching with that of the conductive layer formed on one or both surfaces of the substrate material, and has substantially no fear of peeling or the like.

Figure 1:
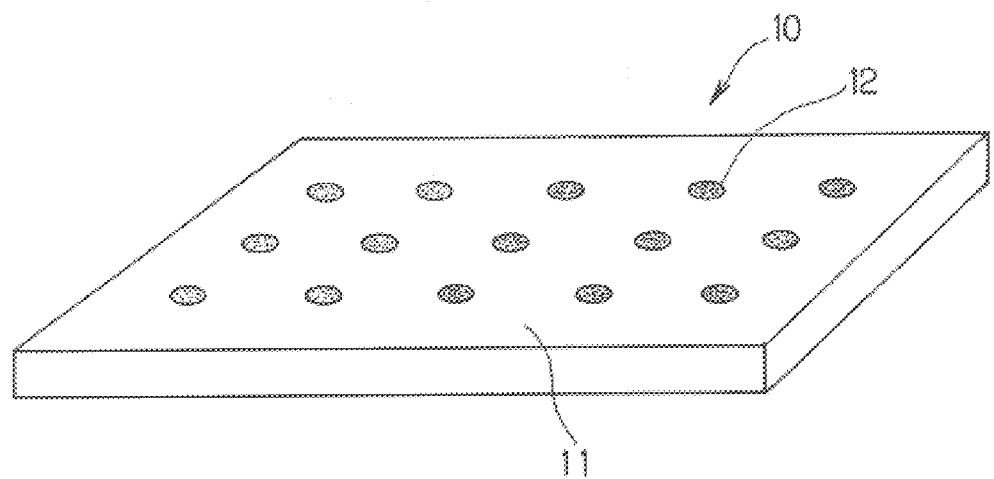
FIG. 1 is a perspective view showing an example of the substrate material for printed circuit according to the present invention.

FIG. 1 is a perspective view showing an example of the substrate material for a printed circuit according to the present invention. A substrate material 10 comprises a sheet-shaped composite material 11 composed of a plastic and a ceramic and metal wires 12 fixed in the composite material at given pitches. The ends of the metal wires 12 are exposed at both surfaces of the composite material 11, whereby the two surfaces of the substrate material 10 can have electrical connection to each other.

Figure 6:
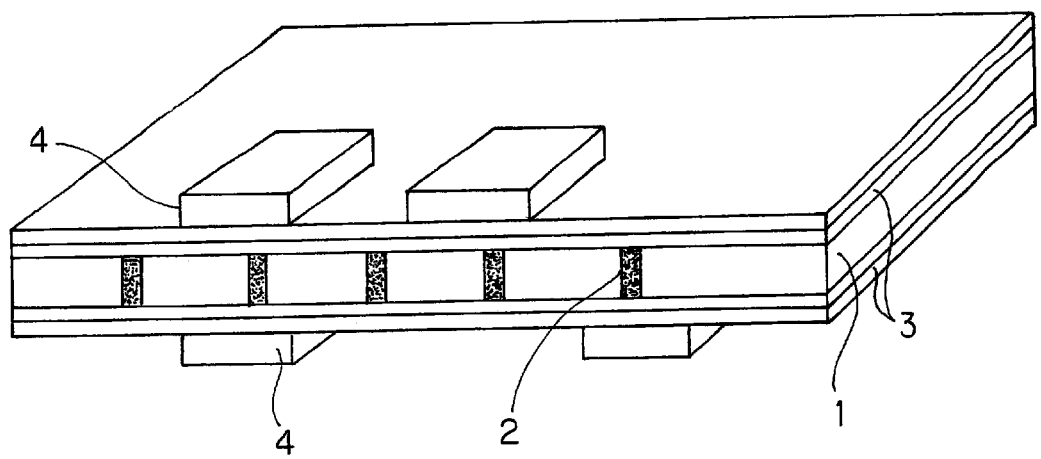
FIG. 6 is a perspective view showing a printed circuit board.

On both surfaces of the thus-constituted substrate material 10 are provided conductive layers 3, in which a desired conductor pattern (a circuit) has been formed and terminals 4, as shown in, for example, FIG. 6, whereby a printed circuit board is formed.

The substrate material of the present invention comprising a plastic and a ceramic can be formed so as to show isotropic thermal expansion and have any desired thermal expansion coefficient ranging from 5 to 30 ppm/° C. By ordinarily forming copper wirings on the substrate material and further mounting a silicon semiconductor, a printed circuit board is formed. The substrate material is necessary to have a thermal expansion coefficient close to that of copper or silicon, in view of the reliability to the thermal history of in-solder dipping step, etc.

The thermal expansion coefficient of copper is about 17 ppm/° C. and that of silicon is about 4 ppm/° C. The thermal expansion coefficient of the substrate material, is preferably 30 ppm/° C. (upper limit) and 10 ppm/° C. (lower limit) when it is allowed to be close to that of copper in designing of mounting; and is preferably 10 ppm/° C. (upper limit) when it is allowed to be close to that of silicon. The lower limit of the thermal expansion coefficient of the substrate material is, as described later, 5 ppm/° C. from the restriction for substrate material production.

Herein, isotropic thermal expansion means that the difference of thermal expansion coefficient in the thickness direction and planar direction of the substrate material is within 30% of the smaller thermal expansion coefficient of the above two.

The composite material constituting the substrate material of the present invention is composed of a plastic and a ceramic and is a dispersion of ceramic particles, a ceramic fiber or the like in a plastic matrix.

The amounts of the plastic and the ceramic in the composite material can be determined appropriately depending upon the properties (e.g. insulation, low thermal expansion and abrasion resistance) and application purpose of the composite material. However, it is preferred that the ceramic particles, the ceramic fiber or the like is present in the composite material in an amount of 40 to 90% by volume because the resulting composite material can show low thermal expansion and, during curing, a small volume contraction.

In the composite material of the present invention, the volume shrinkage during curing can be controlled at 1% or smaller and further at 0.5% or smaller. This is very advantageous for the improvement of the dimensional accuracy of the metal wires fixed in the substrate material.

By controlling the amounts of the plastic and the ceramic in the composite material at the above ranges, low thermal expansion, abrasion resistance, etc. can be effectively given to the composite material.

Specific explanation is made. When there is used, as the plastic, for example, one of various epoxy resins, the thermal expansion coefficient of the epoxy resin is at least about 50 ppm/° C. In order to produce a composite material having a thermal expansion coefficient of 30 ppm/ by using the epoxy resin and a ceramic (a silica glass) having a thermal expansion coefficient of 0.5 ppm/° C., the amount of the ceramic is needed to be 40% by volume. Conversely when a composite material of low thermal expansion coefficient is produced, the amount of the ceramic is preferred to be larger. However, when the content of the ceramic exceeds 90% by volume, the content of the plastic is too low and the resulting substrate material has strikingly low fluidity during molding, making the molding impossible; therefore, the upper limit of the amount of the ceramic is 90% by volume. At this level, the composite material has a thermal expansion coefficient of 5 ppm/° C.

The ceramic includes alumina, zirconia, silicon nitride, etc. and also glass (e.g. silica glass). The ceramic is used in the composite material in the form of particles or fiber.

As the plastic, there can be used any of a thermoplastic resin and a thermosetting resin. As the thermoplastic resin, there can be used various resins, for example, a polyvinyl chloride, a polyethylene and a polypropylene. These resins may be used in combination of two or more kinds.

Meanwhile, as the thermosetting resin, there can be used a phenolic resin, an epoxy resin, a urea resin, etc. These resins may be used in combination of two or more kinds.

As the composite material of the present invention, there is preferred a mixture of a plastic (e.g. an epoxy resin) and a ceramic which is glass fiber chips of desired length or glass beads, because it has no anisotropy in thermal expansion and is excellent in insulation, low thermal expansion, abrasion resistance, strength, etc.

As to the kind of the metal wires fixed in the composite material at given pitches, there is no particular restriction as long as it is a conductive metal. A metal of high electrical conductivity is preferred because fine wiring is made and low electrical resistance is required. Since gold is too expensive, there is preferred, in practical application, any one metal selected from copper, copper alloys, aluminum and aluminum alloys. Beryllium copper is most preferred because it has good electrical conductivity and, moreover, has high Young's modulus and stiffness (this enables application of an appropriate tension when beryllium copper wires are stretched in a mold).

Beryllium copper has a sufficient electrical conductivity (10 to 70% relative to pure copper, although it varies depending upon the composition of beryllium copper), a Vickers hardness of 200 to 450 and excellent abrasion resistance. Further, beryllium copper has excellent flexibility and therefore can absorb strain.

Beryllium bronze preferably has a composition containing 0.2 to 5.0% by weight, based on the total amount (wherein copper is a main component), of beryllium, 0.1 to 3.0% by weight of a total of nickel and cobalt, and 0.05 to 3.0% by weight of a total of at least one element selected from the group consisting of aluminum, silicon, iron, titanium, tin, magnesium, manganese, zinc and indium.

A content of beryllium exceeding 5.0% by weight is not preferred because the metal wires have low conductivity. Meanwhile, when the content of beryllium is lower than 0.2% by weight, the metal wires have insufficient strength. When the content of beryllium is 2.0% by weight, the metal wires have a Young's modulus of 13,000 kg/mm$^2$ and a tensile strength of 160 kg/mm$^2$, which are higher than the Young's modulus of 11,000 kg/mm$^2$ and tensile strength of 60 kg/mm$^2$ of copper, and show a small deformation when pulled; therefore, such wires can be pulled strongly in a mold and can show high dimensional accuracy.

In the substrate material of the present invention, the thermal expansion coefficient of the composite material is preferably at least equal to that of the thermal expansion coefficient of the metal wires, and the difference between the two thermal expansion coefficients is preferably 0 to 10 ppm/° C., more preferably 1 to 5 ppm/° C. The reason is as follows.

For example, when the composite material is poured into a mold at 80° C. and cured at 130° C., no gap is formed between the metal wires and the composite material during the cooling step of the composite material, if the metal wires have a smaller thermal expansion coefficient than the composite material does, and the resulting substrate material can secure reliability. A difference of thermal expansion coefficient, of smaller than 1 gives no favorable effect. When the difference is larger than 10 ppm/° C., the stress at which the metal wires are pressed during the contraction of the composite material, becomes excessive and cracks are generated.

The metal wires fixed in the composite material have an aspect ratio (length/diameter) of preferably 8 or larger, more preferably 10 or larger. When the aspect ratio is 5 or larger, it has heretofore been difficult practically (in mass production) to form through holes ( or via holes) of 0.1 mm in diameter in a substrate of, for example, 0.8 mm in thickness. Therefore, in a substrate of 1.0 mm in thickness, the lower limit of the diameter of the through holes (or via holes) formed therein has been 0.2 mm. In this case, when wirings having, for example, a line width of 0.1 mm and pitches of 0.2 mm were formed between through holes (or via holes) having pitches of 1.27 mm, the largest number of wirings formable between through holes (or via holes) was 4. When the through holes (or via holes) have a diameter of 0.1 mm (that is, an aspect ratio of 8), however, the above number can be 5 and the density of wiring can be increased significantly.

In the substrate material of the present invention, the diameter of metal wires, i.e. the diameter of through holes (or via holes) is preferably 0.15 mm or smaller, more preferably 0.10 mm or smaller, particularly preferably 0.075 mm or smaller. The reason is that such a diameter can realize high-density wirings. In the present invention, since the diameter of through holes (or via holes) is determined by the diameter of metal wires, the former diameter can be made small (for example, even 0.05 mm) as long as metal wires can be processed so as to correspond to such a diameter.

In the composite metal, the metal wires are fixed at pitches of preferably 1.1 mm or smaller, more preferably 0.9 mm or smaller. When 4 wirings having a line width of 0.1 mm are formed between through holes (or via holes) at pitches of 0.2 mm, the pitches between through holes ( or via holes) have been required to be 1.2 mm or larger in the case of conventional through holes (or via holes) having a diameter of 0.2 to 0.3 mm; in the substrate material of the present invention, however, since the diameter of metal wires corresponding to the diameter of through holes (or via holes) can be set at about 0.1 mm, 4 wirings are possible even when the pitches between metal wires are 1.1 mm or smaller, which is very advantageous for high-density wiring.

Desirably, the plastic and the ceramic are each subjected to a coupling treatment and the composite material and the metal wires are bonded to each other by a coupling agent. When the plastic and the ceramic are each subjected to a coupling treatment, the resulting composite material has higher stability. When the composite material and the metal wires are bonded to each other via the coupling agent used for the composite metal, the resulting base metal has a higher bonding strength and the peeling occurring during the use of the substrate material is prevented effectively.

As the coupling agent, there can be used known coupling agents. Effective as silane coupling agents are, for example, those of vinyl type, epoxy type, methacryloxy type, amino type, chloropropyl type and mercapto type. Also effective are primers obtained by dissolving such a silane coupling agent in water, an organic solvent or the like. Besides, there can also be mentioned titanium-based coupling agents and aluminum-based coupling agents.

The bondability between the composite material and the metal wires can also be increased by allowing the metal wires to have surface unevennesses.

In the above, the substrate material of the present invention has been described in detail. The substrate material includes even a substrate material having a copper layer on one or two surfaces thereof.

The copper layer includes a copper foil tightly adhered to the substrate material, a copper layer formed on the substrate material by plating, a copper layer formed by sputtering, etc., and can be formed by any desired method. In a state that a copper layer has been formed on the substrate material, all the through holes have electrical connection; therefore, when the copper layer-formed substrate material is used practically, a pattern is formed by etching or the like. After the copper layer has been peeled by etching, unnecessary through holes may be covered with an epoxy resin or the like which becomes an insulating layer. In order to conduct the positioning of pattern accurately, it is possible to put a mark beforehand on part of the substrate material.

Such a substrate material having a copper layer formed on one or both surfaces is preferred because it makes pattern formation easier.

Next, an example of the present process for production of substrate material is described with reference to FIG. 7.

Figure 7:
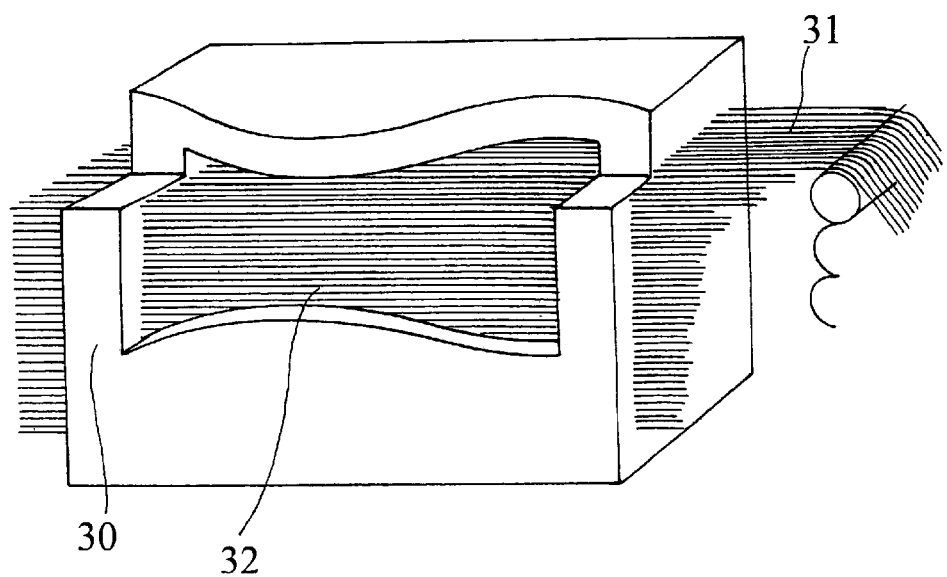
FIG. 7 is a perspective showing an example of the process for production of a substrate material according to the present invention.

As shown in FIG. 7, a large number of metal wires 31 are stretched at given intervals in a mold 30 having a given volume. Then, a composite material 32 composed of a plastic and a ceramic is poured into the mold 30. At this time, vacuum casting is preferred in which the inside of the mold 30 is made vacuum and no gas is present.

Figure 8:
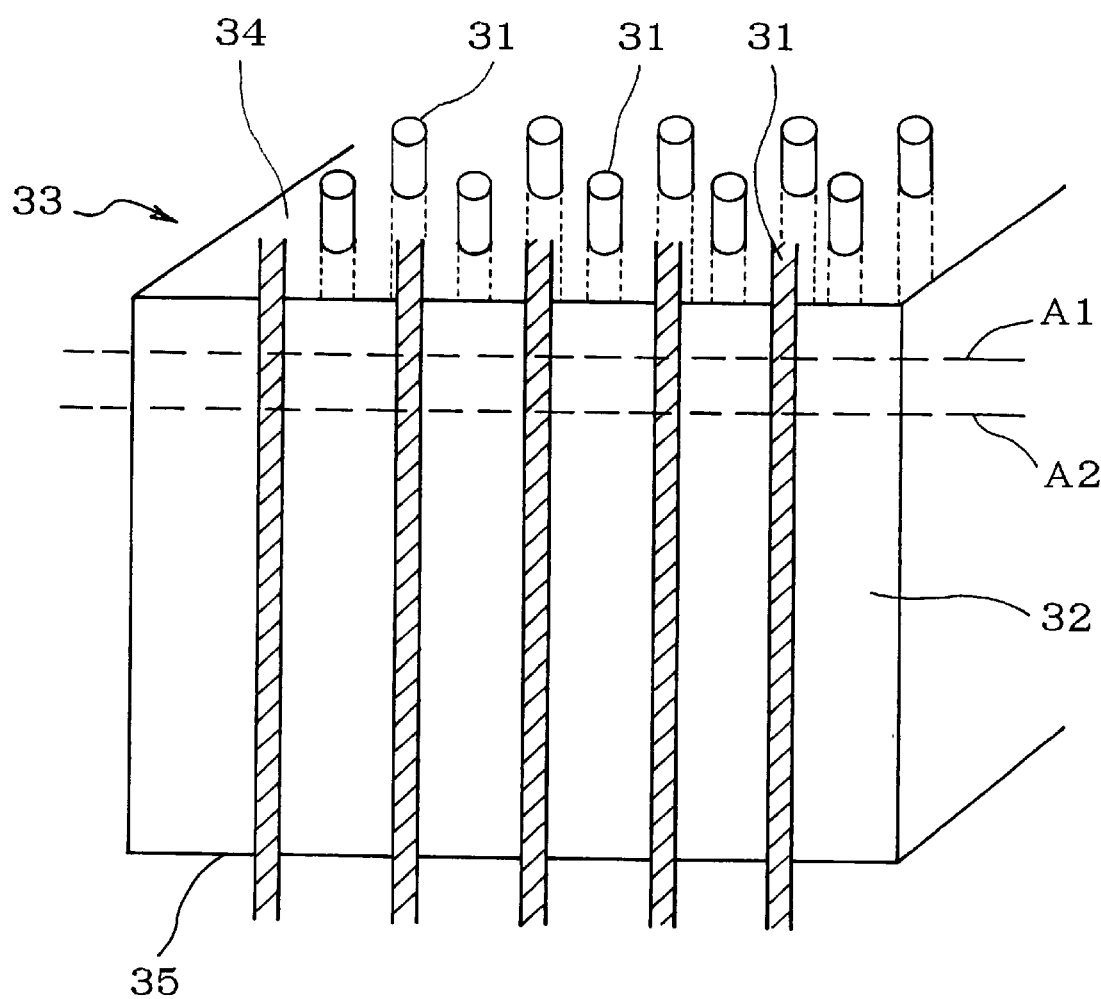
FIG. 8 is a partial perspective view showing an example of the intermediate block of the present invention.

Then, the composite material 32 is cured to form an intermediate block 33 such as shown in FIG. 8.

In FIG. 8, the intermediate block 33 comprises the composite material 32 composed of a plastic and a ceramic and the conductive metal wires 31 fixed in the composite material 32 at given pitches. The content of the ceramic in the composite material 32 is preferably 40 to 90% by volume.

The metal wires 31 are fixed in a state that they extend lineally from one surface 34 of the intermediate block 33 to other surface 35 of the intermediate block 33 facing the surface 34, and project from the surfaces 34 and 35.

After the intermediate block 33 has been produced, the intermediate block 33 is cut at planes A1, A2, etc. all perpendicular to the metal wires using a band saw, a wire saw or the like, whereby a substrate material of the present invention can be produced.

According to the above process, the metal wires 31 can be arranged at given intervals at good dimensional accuracy; therefore, a substrate material can be obtained in which metal wires are arranged at small pitches (a high density) of, for example, about 1 mm or smaller, and cross-talk (which tends to occur in the case of small pitches) can be minimized.

Thus, in the substrate material for printed circuit obtained by the present invention, the diameter of the through holes or via holes (which is determined by the diameter of the metal wires) can be made as small as 0.2 mm or smaller, for example, even 0.05 mm or smaller as long as the metal wires can be processed so as to have a corresponding diameter.

As the material for the mold used in the production process of the present invention, there is desired a material having a thermal expansion coefficient larger than the thermal expansion coefficient of the metal wires used, because during the period of pouring of composite material to it curing, the mold expands more largely than the metal wires and thereby the metal wires receive a tension and are stretched properly.

The present invention is described specifically below by way of Examples.

EXAMPLE 1

As shown in FIG. 7, beryllium bronze wires having a diameter of 0.1 mm were arranged in a mold having inside dimensions of 200 mm×200 mm×500 mm, in a grid form at pitches of 1.27 mm.

An epoxy resin (composite material) containing 70% by volume of silica glass beads was mixed with a curing agent. The mixture was poured into the mold from the side thereof. Incidentally, both the silica glass beads and the beryllium copper wires had beforehand been coated with a silane coupling agent of epoxy type. The pouring of the epoxy resin was conducted with vibration so that the resin spread to all the inside portions of the mold.

After the epoxy resin had been poured into the mold, the whole mold was heated to 130° C. to give rise to curing for about 5 hours, after which the mold was dissembled and an intermediate block was taken out from inside.

The intermediate block was cut in a direction perpendicular to the beryllium copper wires in a thickness of 1 mm using a wire saw, whereby was produced a substrate material 10 having dimensions of 1 mm (thickness)×200 mm×200 mm, comprising an epoxy resin (composite material) 11 and beryllium bronze wires of 0.1 mm in diameter arranged in the epoxy resin at pitches of 1.27 mm.

Examination on the produced substrate material indicated that there was no gap at the interface between the beryllium copper wires and the epoxy resin and the substrate material was highly reliable. Further, the pitches of the beryllium copper wires (corresponding to the pitches between through holes or via holes) were within 1.27±0.02 mm and had good dimensional accuracy. Furthermore, the epoxy resin (composite material) had a thermal expansion coefficient of 18 ppm/° C.

EXAMPLE 2

A copper plating layer was formed on the substrate material produced in Example 1, according to the step described below.

The substrate material was dipped in an etching solution composed mainly of potassium permanganate, to roughen the epoxy resin surface of the substrate material.

After the etching of the substrate material, the substrate material was thoroughly washed, and dipped in a tin chloride solution to activate the surfaces of the substrate material. Further, to promote the growth of copper plating, the substrate material was dipped in a solution containing palladium chloride as a main component, after which electroless copper plating was conducted to form a copper plating thin film layer of about 2 μm. Then, electrolytic copper plating was conducted until a thickness of about 18 μm was obtained, whereby a conductive layer was formed.

The substrate material having a conductive layer on the surfaces were evaluated. It indicated that since the thermal expansions of the substrate material and the conductive layer matched with each other, the conductive layer formed on the substrate material was highly resistant to peeling.

EXAMPLE 3

Figure 2A:
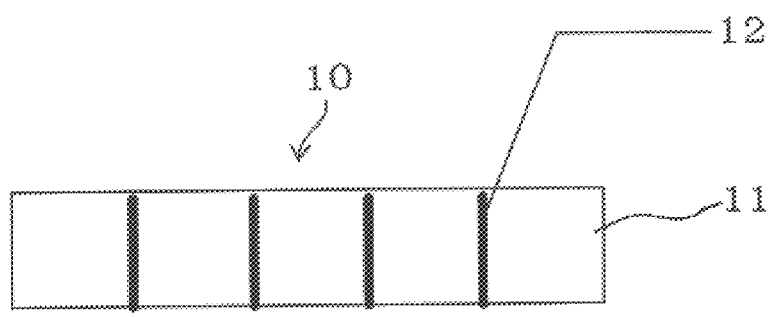
FIGS. 2(a) and 2(b) are sectional views showing an example of the steps for production of a printed circuit board.
Figure 2B:
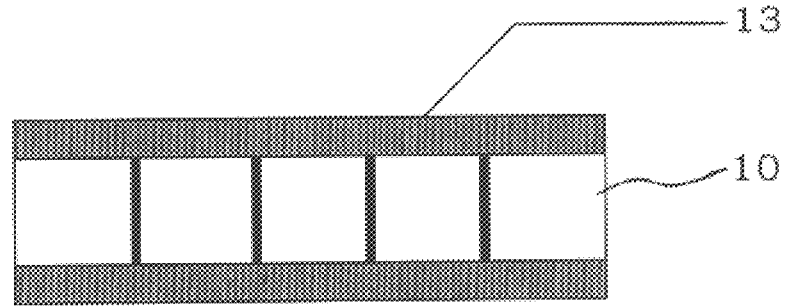
Figure 2C:
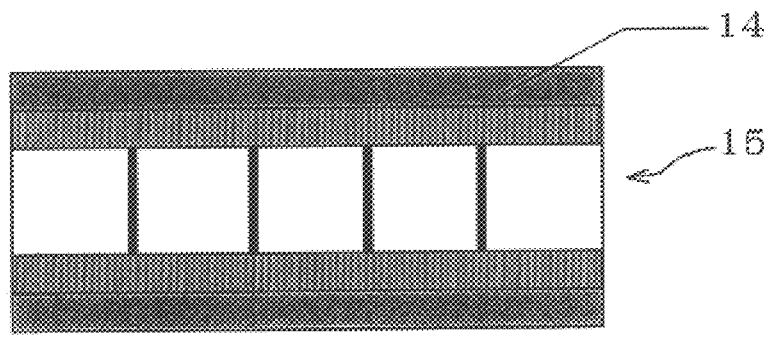
FIG. 2(c) shows an example in which a copper foil has been laminated on a substrate material.

As shown in FIGS. 2(a) and 2(b), an epoxy resin 13 was coated on the substrate material 10 produced in Example 1; thereon was placed a copper foil 14 having a thickness of 50 μm; they were heated in vacuum at 150° C. for 1 hour and simultaneously therewith pressed at a pressure of about 50 kg/cm$^2$ to give rise to lamination to obtain a copper foil-laminated substrate 15.

EXAMPLE 4

Figure 3A:
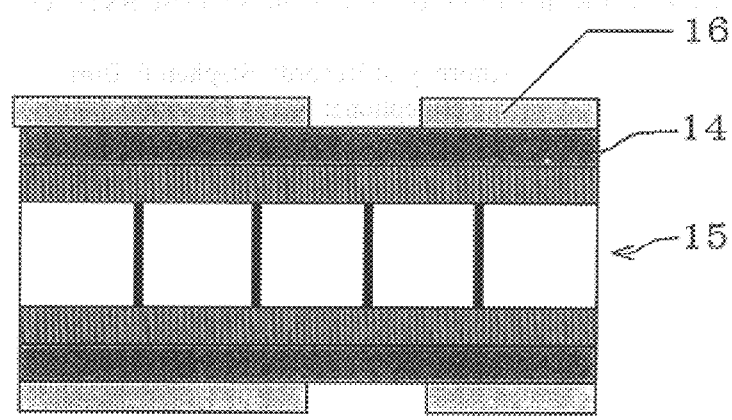
FIGS. 3(a), 3(b) and 3(c) are sectional views showing an example of the steps for production of a printed circuit board.

On the copper foil-laminated substrate 15 obtained in Example 3 was laminated a photosensitive film-shaped resist 16, as shown in FIG. 3(a). Then, light exposure was made via a mask in which a desired conductor pattern had been drawn, after which the unexposed portion of the resist 16 was removed with a developer to form a resist pattern.

Figure 3B:
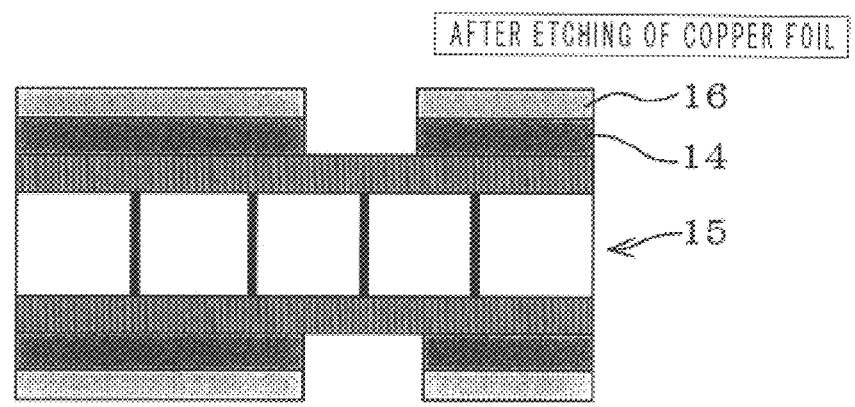

Then, using an etching solution containing iron chloride as a main component, the portion of the copper foil not covered with the resist film was etched and removed; subsequently, the resist was peeled to remove the unnecessary portion of the copper foil, as shown in FIG. 3(b).

Figure 3C:
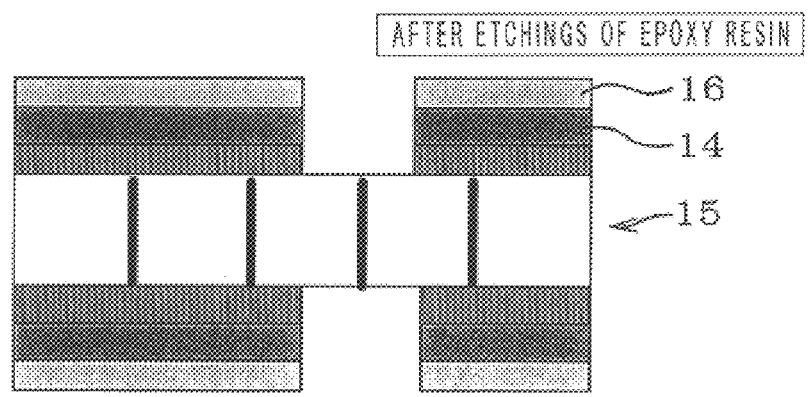

Then, in order to remove the epoxy resin layer remaining on the copper foil-laminated substrate 15, the copper foil-laminated substrate 15 was dipped in an etching solution containing potassium permanganate as a main component, to remove the epoxy resin layer, as shown in FIG. 3(c).

Figure 4A:
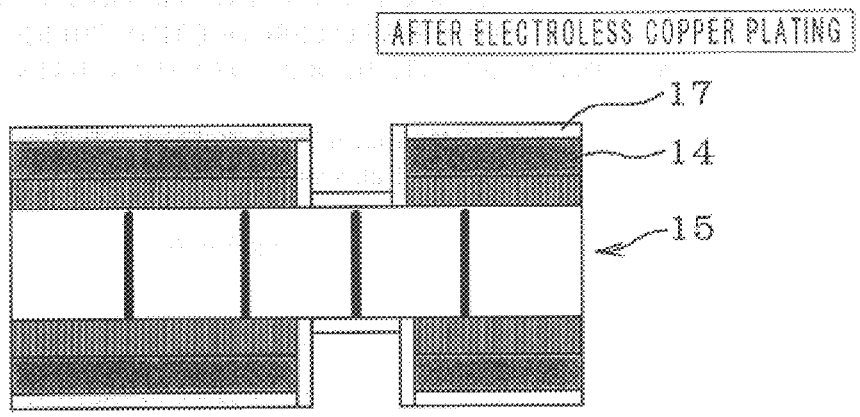
FIGS. 4(a) and 4(b) are sectional views showing an example of the steps for production of a printed circuit board.

Then, in order to promote the growth of copper plating, the resulting material was dipped in a solution containing palladium chloride as a main component; thereafter, electroless copper plating was conducted to form a copper plating thin film layer 17 of about 2 μm, as shown in FIG. 4(a).

Figure 4B:
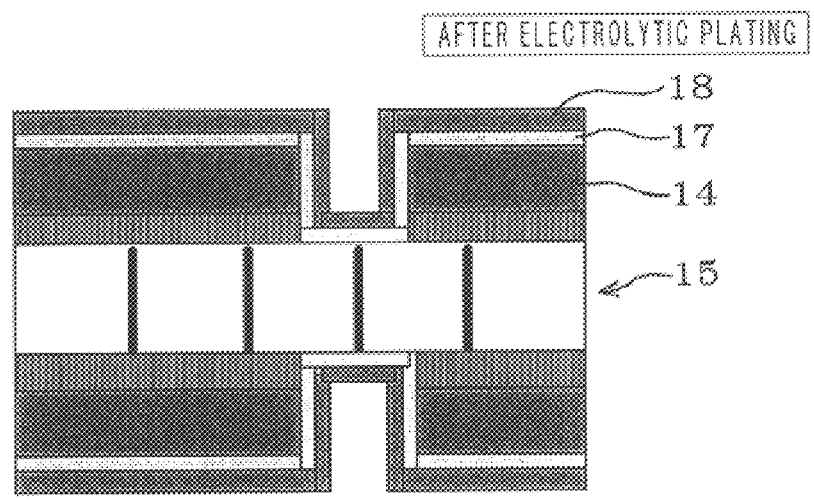

Then, electrolytic copper plating was conducted until a thickness of about 10 μm was obtained, whereby a conductive layer 18 was formed on the copper plating thin film layer 17, as shown in FIG. 4(b).

Figure 5A:
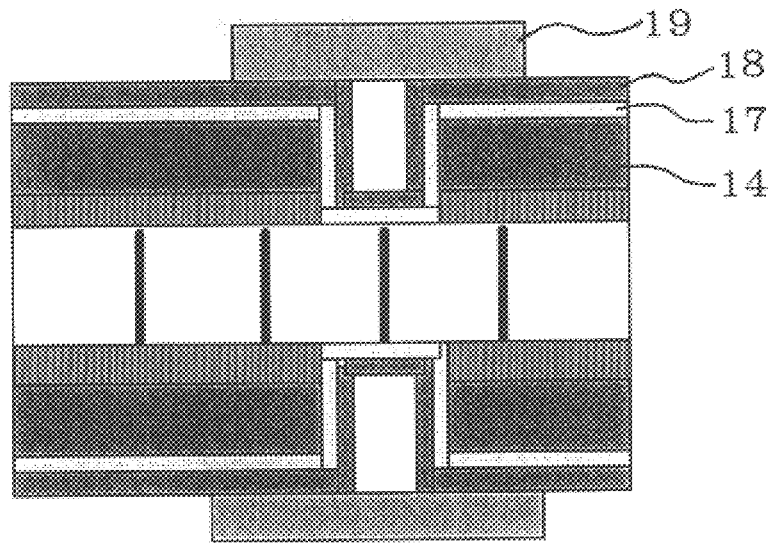
FIGS. 5(a) and 5(b) are sectional views showing an example of the steps for production of a printed circuit board.

Then, in order to form a conductor pattern, a photosensitive film-shaped resist 19 was laminated. Thereafter, light exposure was made via a mask in which a desired conductor pattern had been drawn, and the unexposed portion was removed with a developer to form a resist pattern, as shown in FIG. 5(a).

Figure 5B:
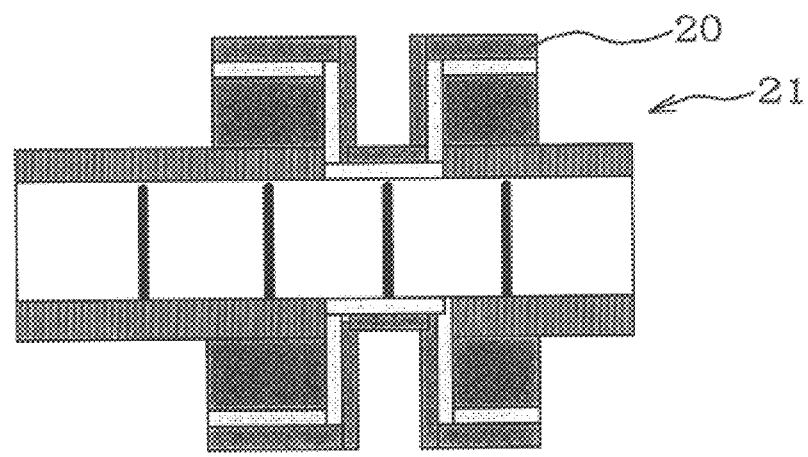

Then, using an etching solution containing iron chloride as a main component, the portions of the copper plating layer and the copper foil, not covered with the resist film were removed; subsequently, the resist was peeled to obtain a second conductive layer 20, as shown in FIG. 5(b); thereby, a printed circuit board 21 having a plurality of conductive layers was produced.

Evaluation

As described above, the substrate material of the present invention had no gap at the interface between the beryllium copper wires and the composite material (epoxy resin) and was highly reliable. Further, the substrate material, having a thermal expansion well matching with that of the conductive layer formed thereon, hardly showed peeling from the conductive layer.

The substrate material, when having a copper layer formed thereon, made it easier to form a conductor pattern thereon.

Industrial Applicability

As described above, the substrate material for printed circuit according to the present invention can ensure good electrical conduction and, by possessing controlled thermal expansion, is, in use, substantially free from peeling between the substrate material and the conductive layer formed thereon or between the insulating material and the metal wires.

Further, by using the substrate material for printed circuit according to the present invention, there can be obtained a printed circuit board of higher density and yet excellent dimensional accuracy.

Furthermore, by using the intermediate block of the present invention, there can be produced a substrate material for printed circuit easily and efficiently.

What is claimed is:

1. A substrate material for a printed circuit, comprising:
   a sheet-shaped composite material composed of a plastic and a ceramic, said ceramic being dispersed in said plastic; and
   conductive metal wires fixed in the composite material at given pitches, said metal wires each having an aspect ratio (length/diameter) of 8 or larger,
   wherein the two surfaces of the substrate material have electrical connection to each other via the metal wires.

2. A substrate material for printed circuit according to claim 1, wherein a copper layer is formed on one or two surfaces of the substrate material.

3. A substrate material for printed circuit according to claim 1, wherein the content of the ceramic in the composite material is 40 to 90% by volume.

4. A substrate material for printed circuit according to claim 1, wherein in the composite material, the plastic and the ceramic have each been subjected to a coupling treatment.

5. A substrate material for printed circuit according to claim 1, wherein the metal wires and the composite material are bonded to each other by a coupling agent.

6. A substrate material for printed circuit according to claim 1, wherein the composite material is constituted by an epoxy resin and a glass fiber cut into a predetermined length or glass beads.

7. A substrate material for printed circuit according to claim 1, wherein the metal wires are fixed in the sheet-shaped composite material at pitches of 1.1 mm or smaller.

8. A substrate material for printed circuit according to claim 1, wherein the metal wires have a diameter of 0.2 mm or smaller.

9. A substrate material for printed circuit according to claim 1, which shows isotropic thermal expansion and has a thermal expansion coefficient of 5 to 30 ppm/° C.

10. A substrate material for printed circuit according to claim 1, wherein the composite material has a thermal expansion coefficient not smaller than that of the metal wires and the difference of the two thermal expansion coefficients is 1 to 10.

11. A substrate material for printed circuit according to claim 1, wherein the metal wires are composed of any one metal selected from copper, copper alloys, aluminum and aluminum alloys.

12. A substrate material for printed circuit according to claim 1, wherein the metal wires are composed of beryllium copper.

13. An intermediate block used in production of a substrate material for a printed circuit, comprising a composite material composed of a plastic and a dispersed ceramic and conductive metal wires fixed in the composite material at given pitches, said metal wires being composed of beryllium copper, wherein the content of the dispersed ceramic in the composite material is 40 to 90% by volume and wherein the metal wires extend lineally from one surface of the intermediate block to an other surface of the intermediate block facing the one surface and project from the two surfaces.

14. An intermediate block used in production of a substrate material for printed circuit, set forth in claim 13, which shows isotropic thermal expansion and has a thermal expansion coefficient of 5 to 30 ppm/° C.

15. A process for producing a substrate material for a printed circuit, which comprises stretching, in a mold, conductive metal wires at given pitches, said metal wires ea having a diameter of 0.2 mm or smaller, then pouring, into the mold, a composite material composed of a plastic and a ceramic, curing the composite material to provide a composite material composed of said plastic and said ceramic, said ceramic being dispersed in said plastic, thereafter slicing the resulting material in a direction perpendicular to the direction of the metal wires.

16. A process for producing a substrate material for printed circuit, set forth in claim 15, wherein the content of the ceramic in the composite material is 40 to 90% by volume.

17. A process for producing a substrate material for printed circuit, set forth in claim 15, wherein in the composite material, the plastic and the ceramic have each been subjected to a coupling treatment.

18. A process for producing a substrate material for printed circuit, set forth in claim 15, wherein the metal wires and the composite material are bonded to each other by a coupling agent.

19. A process for producing a substrate material for printed circuit, set forth in claim 15, wherein the composite material is constituted by an epoxy resin and a glass fiber cut into a predetermined length or glass beads.

20. A process for producing a substrate material for printed circuit, set forth in claim 15, wherein the metal wires are composed of one metal selected from copper, copper alloys, aluminum and aluminum alloys.

21. A process for producing a substrate material for printed circuit, set forth in claim 15, wherein the metal wires are composed of beryllium copper.

22. A process for producing a substrate material for printed circuit, set forth in claim 15, wherein the material constituting the mold has a thermal expansion coefficient larger than that of the metal wires.

23. A process for producing a substrate material for printed circuit, set forth in claim 15, wherein the metal wires have a diameter of 0.2 mm or smaller and are fixed in the mold at pitches of 1.1 mm or smaller.

* * * * *